US008013605B2

(12) United States Patent
Matschl

(10) Patent No.: US 8,013,605 B2
(45) Date of Patent: Sep. 6, 2011

(54) MAGNETIC RESONANCE SYSTEM HAVING A SUPERCONDUCTING WHOLE-BODY RECEIVING ARRANGEMENT

(75) Inventor: Volker Matschl, Knoxville, TN (US)

(73) Assignee: Siemens Aktiengesellschaft, Munich (DE)

(*) Notice: Subject to any disclaimer, the term of this patent is extended or adjusted under 35 U.S.C. 154(b) by 297 days.

(21) Appl. No.: 11/919,894

(22) PCT Filed: Feb. 2, 2007

(86) PCT No.: PCT/EP2007/051005
§ 371 (c)(1),
(2), (4) Date: Jan. 30, 2009

(87) PCT Pub. No.: WO2007/104607
PCT Pub. Date: Sep. 20, 2007

(65) Prior Publication Data
US 2009/0219024 A1     Sep. 3, 2009

(30) Foreign Application Priority Data

Mar. 10, 2006    (DE) .......................... 10 2006 011 254

(51) Int. Cl.
*G01V 3/00* (2006.01)
(52) U.S. Cl. ........................................... 324/318
(58) Field of Classification Search .......... 324/300–322; 600/407–445
See application file for complete search history.

(56) References Cited

U.S. PATENT DOCUMENTS

| | | | |
|---|---|---|---|
| 5,143,688 A | 9/1992 | Mansfield | |
| 5,655,533 A * | 8/1997 | Petropoulos et al. | 600/422 |
| 5,661,400 A | 8/1997 | Plies et al. | |
| 5,889,456 A | 3/1999 | Triebe et al. | |
| 6,121,776 A | 9/2000 | Marek | |
| 6,377,047 B1 | 4/2002 | Wong et al. | |
| 7,084,635 B2 * | 8/2006 | Morita et al. | 324/322 |
| 7,560,932 B2 * | 7/2009 | Fukuda et al. | 324/322 |
| 2006/0017440 A1 | 1/2006 | Freytag | |
| 2008/0154117 A1 * | 6/2008 | Nielles-Vallespin | 600/410 |
| 2010/0286503 A1 * | 11/2010 | Greiser et al. | 600/410 |

OTHER PUBLICATIONS

"Non-Diode Decoupling Technique for HTS coil Imaging," Chan et al., Proc. Intl. Soc. Mag. Reson. Med. vol. 10 (2002), p. 896.
Superconducting Single and Phased-Array Probes for Clinical and Research MRI,: Wosik et al., IEEE Trans. on Applied Superconductivity, vol. 13, No. 2 (2003) pp. 1050-1056.
"Superconducting RF Coils for Clinical MR Imaging at Low Field," Ma et al., Academic Radiology, vol. 10, No. 9 (2003) pp. 978-987.
"Superconducting and Cold Copper MRI Coils," Bourne, Proc. Intl. Soc. Mag. Reson. Med. 5(1997) p. 1527.
"Superconducting Coil Array for Parallel Imaging," Wosik et al., Proc. Intl;. Soc. Mag. Reson. Med. 13(2005) p. 678.

(Continued)

*Primary Examiner* — Brij B Shrivastav
(74) *Attorney, Agent, or Firm* — Schiff Hardin LLP

(57) ABSTRACT

A data acquisition unit of a magnetic resonance system has an examination region therein, relative to which an examination subject is conveyed by a patient bed. The data acquisition unit has a built-in radio-frequency transmission arrangement, that radiates radio-frequency energy into the examination subject, and a built-in reception arrangement that receives radio-frequency magnetic resonance signals emitted from the examination subject as a result of excitation by the radiated radio-frequency energy. The reception arrangement operates as a resistive arrangement when the radio-frequency energy is being radiated by the transmission arrangement, and operates as a superconducting arrangement when the magnetic resonance signals are being received thereby.

14 Claims, 4 Drawing Sheets

OTHER PUBLICATIONS

"High Temperature Superconducting Surface Coils with Liquid Nitrogen or Pulse Tube Refrigeration," Vester et al., Proc. Intl. Soc. Mag. Reson. Med. 5(1997) p. 1528.

"Superconducting MR Surface Coils for Human Imaging," Ma et al., www.supertron.com/Product/Publications/pub-3.htm (2005).

* cited by examiner

MAGNETIC RESONANCE SYSTEM HAVING A SUPERCONDUCTING WHOLE-BODY RECEIVING ARRANGEMENT

BACKGROUND OF THE INVENTION

1. Field of the Invention

The invention concerns a magnetic resonance system of the type having a whole body arrangement for receiving RF magnetic resonance (MR) signals.

2. Description of the Prior Art

Magnetic resonance systems are generally known that include a data acquisition unit that has an examination region that is open axially on both sides relative to a central axis thereof, the examination region being radially surrounded by an inner wall. A patient on a transport bed is movable into and out of the examination region, along the central axis of the examination region. A substantially homogenous static basic magnetic field is generated in the examination region by a basic field magnet in the data acquisition unit. Radio-frequency energy is radiated into the examination subject by a transmission arrangement that radially surrounds the examination region. The radiation radio-frequency energy causes magnetic resonance signals to be emitted from the examination subject, which are detected by a reception arrangement that also radially surrounds the examination region.

The RF transmission and reception arrangement that is built into the data acquisition unit is referred to as whole-body antenna arrangement, and is stationary with respect to the data acquisition unit.

In known systems of this type, the transmission arrangement is normally identical with the reception arrangement. This combined transmission/reception arrangement is often fashioned as a birdcage resonator.

A homogeneous excitation of the person located in the examination region to magnetic resonances is possible by means of magnetic resonance systems fashioned in such a way. A homogeneous reception of excited magnetic resonances from the entire examination region is also possible. Various three-dimensional reconstructions are determined using the acquired magnetic resonance signals with the use of the whole-body reception arrangement, but only at inferior quality. Therefore local coils are often used for the acquisition of magnetic resonance signals. Qualitatively significantly higher-grade reconstructions are often possible by means of local coils. However, local coils exhibit the disadvantage that they must be manually applied on the patient and also must be manually removed again. Their use is therefore relatively time-consuming. Furthermore, acquisition of magnetic resonance signals by means of an individual local coil is possible only from a small part of the entire examination region. The person must therefore be covered by means of many local coils over a large area. This is often subjectively perceived to be uncomfortable.

The signal strength that occurs in the acquisition mode in magnetic resonance applications is also relatively low. Significant efforts are therefore undertaken to keep the noise optimally low, thus to maximize the signal-to-noise ratio (SNR). The use of cooled local coils is one possibility for minimization of noise. A further possibility is the use of superconducting coils. Superconducting coils are, for example, described in WO-A-01/94964 as well as in the following technical articles:

"Superconducting RF Coils for Clinical MR Imaging at Low Field" by Q. Y. Ma et al., Academic Radiology, Vol. 10, Nr. 9, September 2003, pages 978 to 987;

"Superconducting and Cold Copper MRI Coils" by L. C. Bourne, appearing in ISMRM $5^{th}$ (1997), page 1527;

"Superconducting Coil Array for Parallel Imaging" by J. Wosik et al., appearing in Proc. Intl. Soc. Mag. Reson. Med. 13 (2005), page 678;

"High Temperature Superconducting Surface Coils with Liquid Nitrogen or Pulse Tube Refrigeration" by Markus Vester et al., appearing in ISMRM $5^{th}$ (1997), page 1528;

"Superconducting MR Surface Coils for Human Imaging" by Q. Y. Ma et al., placed on the Internet and retrievable at http://www.supertron.com/Product/Publications/pub-3.htm.

In all publications cited above, small coils are always used as the coils. In one of the publications it is even explicitly stated that a noteworthy improvement of the SNR is to be expected only for coil diameters of at maximum 12 cm. Such dimensions are thus significantly smaller than the typical diameter of a whole-body transmission and reception arrangement. This diameter is normally 50 to 65 cm.

A system of superconducting resonators for magnetic resonance applications is known from EP 1 626 286 A1. The resonators can effect a current distribution that is nearly identical with that of a conventional birdcage resonator. The system can be dimensioned such that magnetic resonance whole-body measurements are possible. It is used both in the transmission case and in the reception case.

SUMMARY OF THE INVENTION

An object of the present invention is to provide a magnetic resonance system that is fashioned relatively simply and by means of which a qualitatively high-grade "screening" of a person can be implemented relatively quickly.

The object is achieved according to the invention by a magnetic resonance system wherein the reception arrangement is fashioned such that it acts as a resistive reception arrangement in the event that the radio-frequency excitation field is generated by means of the transmission arrangement and acts as a superconducting reception arrangement in the event that excited magnetic resonance signals are received by means of the reception arrangement.

The transmission arrangement can be identical to the reception arrangement (i.e., the same structure that forms the transmission arrangement also forms the reception arrangement). In this case the reception arrangement has reception elements in which a reception current oscillates in a current flow direction in the reception case and an excitation current oscillates in the current flow direction in the transmission case. Viewed transverse to the current flow direction, the reception elements exhibit a superconducting partial cross-section and a non-superconducting partial cross-section. The superconducting partial cross-sections exhibit a current carrying capacity (current rating) that lies between the reception current and the excitation current. Due to this design the reception current oscillates in the superconducting partial cross-section and the excitation current oscillates in the non-superconducting partial cross-section.

Alternatively, the transmission arrangement can be an arrangement different from the reception arrangement. In this case the reception arrangement exhibits a current carrying capacity that is smaller than an induced current that is induced in the reception arrangement by the radio-frequency excitation field.

When the transmission arrangement is identical with the reception arrangement, the reception arrangement is formed by a number of superconducting reception coils. Due to the relatively low current carrying capacity of the reception coils, in this case (thus when the superconducting reception coils are also used for emission of the radio-frequency excitation field) it can be advantageous for the reception coils to have a number of windings. The reception coils can then generate a strong radio-frequency excitation field with a relatively low current. However, it is also possible for the reception arrangement to be fashioned otherwise. It can in particular be fashioned as a birdcage resonator.

The reception arrangement can also be formed by a number of superconducting reception coils when the transmission arrangement is an arrangement different from the reception arrangement. The transmission arrangement can be fashioned in a conventional manner. For example, it can be fashioned as a birdcage resonator.

As already mentioned, the superconducting reception arrangement exhibits a relatively low current carrying capacity. It is therefore possible for a detuning circuit to be associated only with the transmission arrangement with the reception arrangement having no detuning circuit. The transmission arrangement can be cooled. In this case more precise excitation pulses can be emitted.

The reception coils are mutually thermally shielded from the examination region and from gradient coils. It is preferable, however, to individually thermally shield the reception coils from the examination region and from the gradient coils.

The basic magnet can be a permanent magnet or an electromagnet. When the basic magnet is an electromagnet, it is preferably superconducting. In particular, in this case a common cooling device can be associated with the basic magnet and the reception coils.

A magnetic resonance signal received by the reception arrangement is preferably wirelessly taken from the reception arrangement to an evaluation device. It is then possible to completely encapsulate a cooling reservoir in which the reception arrangement is arranged. The tapping of the received magnetic resonance signal can ensue, for example, via coupling elements that are arranged inside and outside the cooling reservoir. A preamplifier device is normally arranged downstream from the reception arrangement. The preamplifier device is advantageously also cooled. The signal-to-noise ratio can thereby be optimized.

DESCRIPTION OF THE PREFERRED EMBODIMENTS

Figure 1:
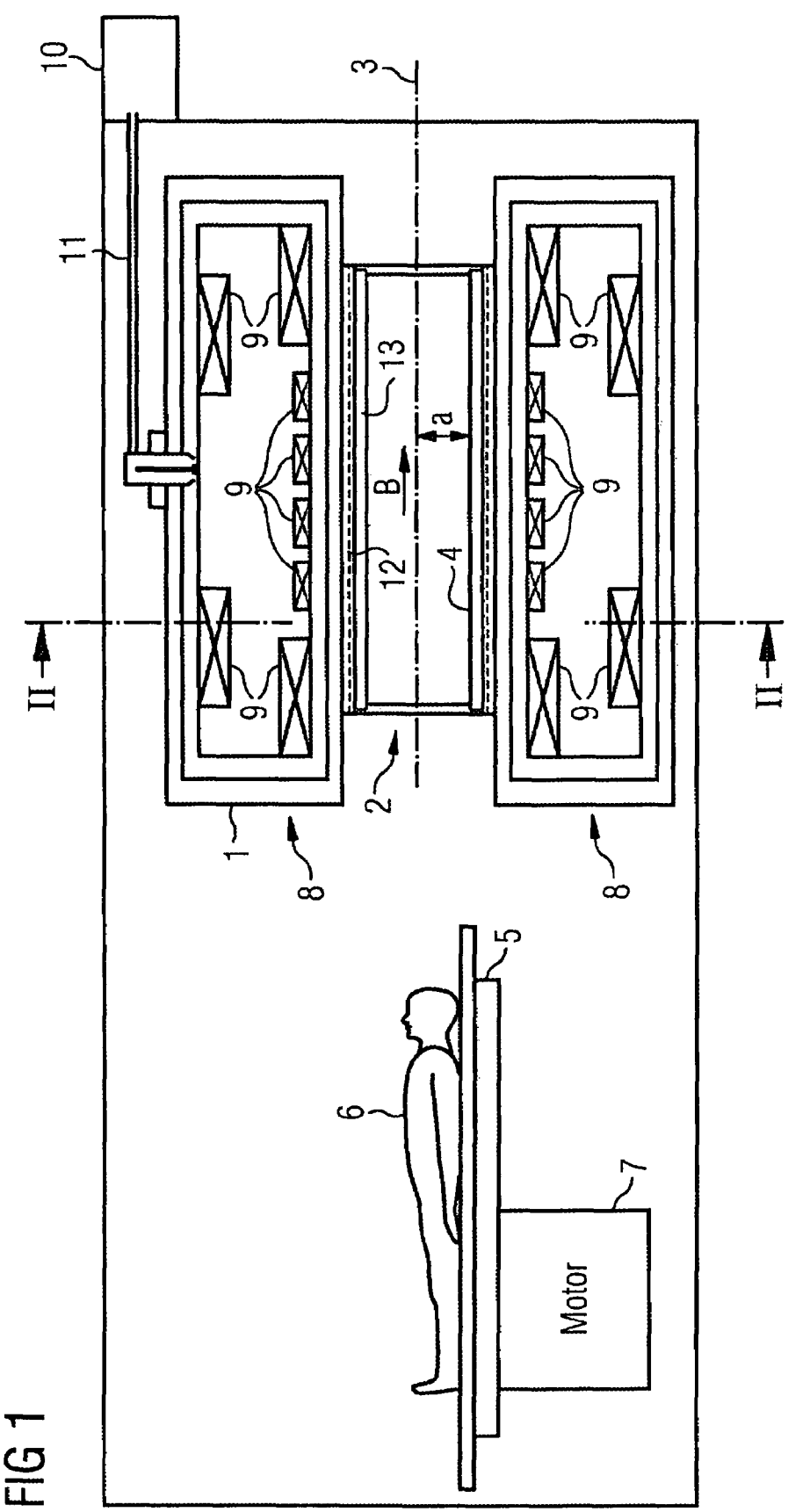
FIG. 1 schematically illustrates a magnetic resonance system from the side.
Figure 2:
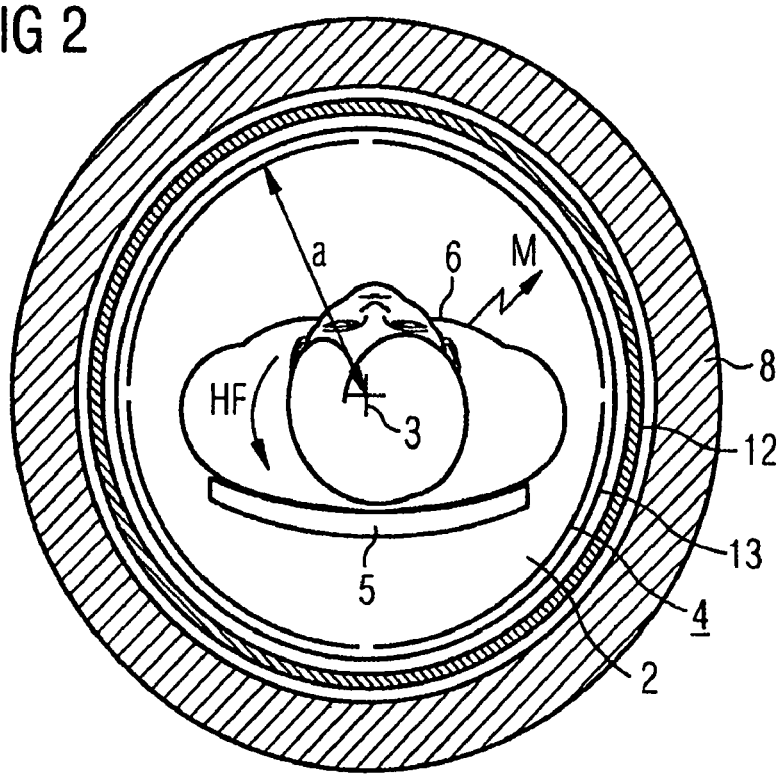
FIG. 2 is a section through the magnetic resonance system of FIG. 1 along a line II-II in FIG. 1.

According to FIGS. 1 and 2, a magnetic resonance system comprises a base body 1. The base body 1 exhibits an examination region 2. The examination region 2 is normally fashioned essentially symmetrically around a central axis 3. It is open axially relative to the central axis 3 (i.e. in the direction of the central axis 3) on both sides. It is bounded by an inner wall 4 of the base body 1 radial to the central axis 3 (meaning away from the central axis 3 or toward the central axis 3). The inner wall 4 is normally at least essentially closed tangential to the central axis 3 (i.e. around the central axis 3).

The inner wall 4 exhibits a distance "a" from the central axis 3. The distance "a" can be constant. In this case the examination region 2 is strictly circular in cross-section (as viewed relative to the central axis 3). For example, the distance "a" can be constant and lie between 25 and 35 cm. This case is presented in FIG. 2.

However, the distance "a" could also be position-dependent. In this case the examination region 2 would be, for example, elliptical or oval in cross-section as viewed relative to the central axis 3. If the examination region 2 is, for example, elliptical or oval in cross-section relative to the central axis 3, the distance "a" can, for example, be approximately 35 cm horizontally, approximately 25 cm vertically.

Independent of the constancy or non-constancy of the distance "a", the distance "a" is determined such that a transport bed 5 together with a person 6 lying on the transport bed 5 can be conveyed through the examination region 2.

According to FIG. 1, a transport bed drive 7 is associated with the transport bed 5. The transport bed 5 (naturally together with the person 6) can be conveyed through the examination region 2 by means of the transport bed drive 7.

The magnetic resonance system furthermore comprises a basic field magnet 8. A static basic magnetic field B that is at least essentially homogeneous within the examination region 2 can be generated by the basic field magnet 8.

According to the representation in FIGS. 1 and 2, the basic magnet 8 is fashioned as a system of ring magnets 9 that is arranged concentrically relative to the central axis 3. Elliptical or oval ring magnets 9 turning around the central axis 3 are also known. In these cases the basic magnetic field B runs parallel to the central axis 3. However, other embodiments are also possible in which the basic magnetic field B runs perpendicular to the central axis 3.

The basic field magnet 8 can in principle be fashioned in an arbitrary manner, for example as a permanent magnet or as an electromagnet. It is advantageously fashioned as a superconducting magnet. A cooling device 10 by means of which a coolant medium 11 (normally liquid air or liquid nitrogen) is cooled is therefore associated with the basic field magnet 8.

A transmission arrangement 12 and a reception arrangement 13 are arranged radially outward, abutting the inner wall 4. They radially surround the outside of the examination region 2. Both the transmission arrangement 12 and the reception arrangement 13 are arranged stationary relative to the examination region 2. The reception arrangement 13 is fashioned as a superconducting reception arrangement 13.

A radio-frequency excitation field RF that is at least essentially homogeneous in the entire examination region 2 can be generated by the transmission arrangement 12. The person 6 (insofar as he is located in the examination region 2) can therefore be excited to emit magnetic resonance signals M by means of the radio-frequency excitation field RF. The excited magnetic resonance signals M can be received by means of the reception arrangement 13. The reception within the examination region 2 is thereby possible, independent of the precise location at which the magnetic resonance signals M are excited. By means of the reception arrangement 13, it is thus possible to receive excited magnetic resonance signals from the entire examination region 2.

The transmission arrangement 12 and the reception arrangement 13 are only schematically depicted in FIGS. 1 and 2. From FIGS. 3 and 4 it is apparent that the reception arrangement 13 is fashioned not as a single-unit resonance structure but rather comprises a number of reception coils 14. Each one of the reception coils 14 receives a magnetic resonance signal M from a portion of the examination region 2. In their entirety the reception coils 14 cover the entire examination region 2, and in fact do so with an essentially uniform sensitivity. The reception arrangement 13 could also be fashioned differently, for example as a birdcage resonator or as a TEM.

Figure 5:
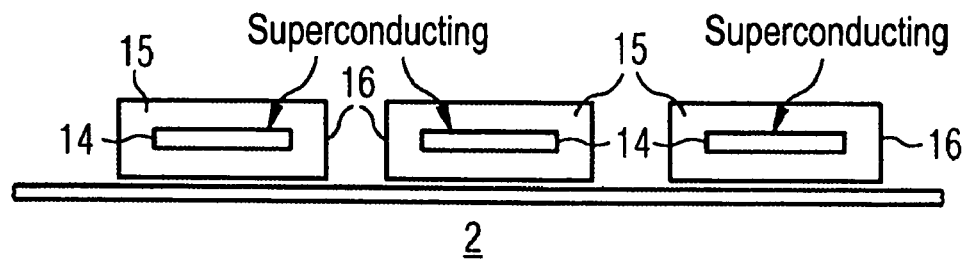
FIG. 5 schematically illustrates a number of reception coils.
Figure 3:
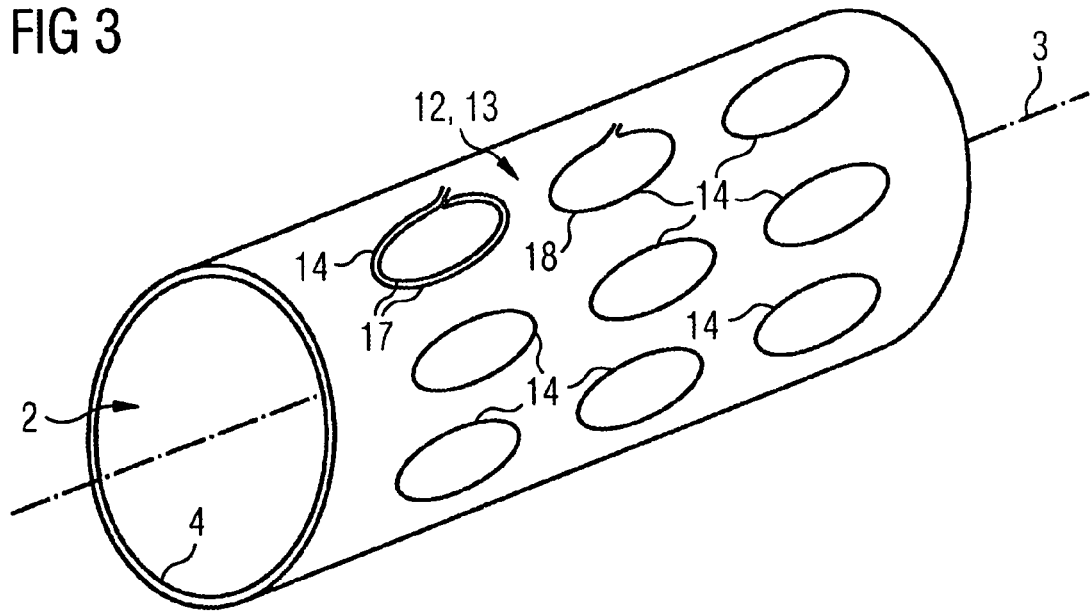
FIG. 3 illustrates a first exemplary embodiment of a transmission arrangement and a reception arrangement in accordance with the invention.
Figure 4:
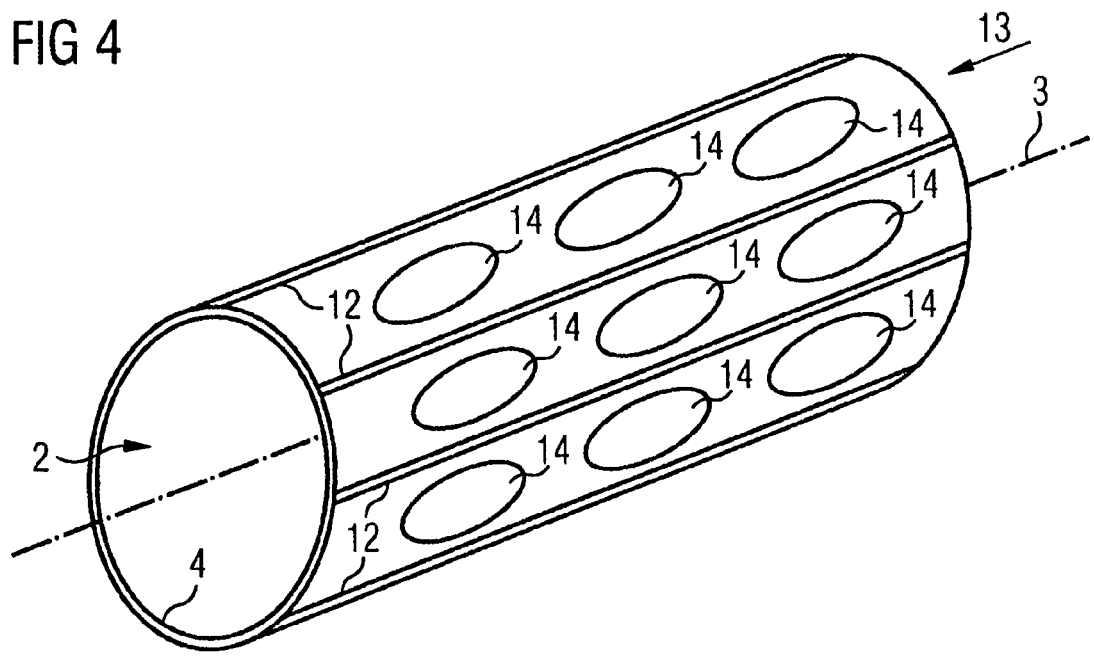
FIG. 4 illustrates a second exemplary embodiment of a transmission arrangement and a reception arrangement in accordance with the invention.

The reception coils 14 are fashioned as superconducting reception coils 14 according to FIGS. 3 and 4. They are even advantageously fashioned as high temperature superconductors, thus as superconductors with a transition temperature above 77 Kelvin or, respectively, 196° C. According to FIG. 5 they are surrounded by a cooling medium 15, normally liquid air or liquid nitrogen. In the preferred embodiment according to FIG. 5, each reception coil 14 comprises its own shielding 16. By means of the shielding 16, the reception coils are thermally shielded from their environment, in particular from the examination region 2 as well as from gradient coils (not shown). The reception coils 14 are thus advantageously individually thermally shielded from the examination region 2 and from the gradient coils. A suitable shielding 16 is, for example, described in DE-C-196 39 924.

Figure 6:
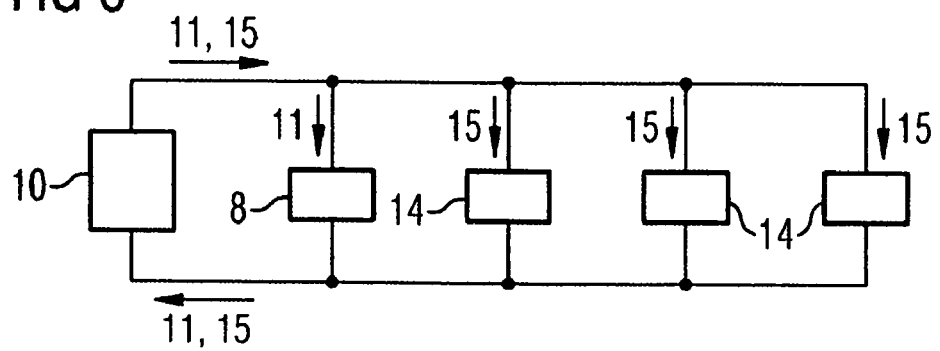
FIG. 6 schematically illustrates a cooling circuit.

It is possible for a separate coolant circuit to be associated with the reception coils 14. When the basic field magnet 8 is also fashioned as a superconductor, a common cooling device (here the cooling device 10) is advantageously associated with the basic field magnet 8 and the reception coils 14. This is schematically presented in FIG. 6.

According to FIG. 3, the transmission arrangement 12 is identical to the reception arrangement 13. In particular in this case, when the reception arrangement 13 thus also serves for emission of the radio-frequency excitation field, it can be reasonable when the reception coils 14 exhibits a plurality of windings 17. This is depicted for one of the reception coils 14 in FIG. 3. A stronger radio-frequency excitation field RF can thereby be generated. However, depending on the situation of the individual case it can also be sufficient when the reception coils 14 exhibit only a single conductor loop 18. This is shown for another of the reception coils 14 in FIG. 3. The remaining reception coils 14 are only schematically depicted in FIG. 3.

According to FIG. 4, the transmission arrangement 12 is an arrangement different than the reception arrangement 13. In this case the reception arrangement 13 also advantageously comprises a number of superconducting reception coils 14. The reception coils 14 can alternatively exhibit a plurality of windings 17 or comprise a single conductor loop 18, as needed. The transmission arrangement 12 can be fashioned in a conventional manner in the embodiment according to FIG. 4. For example, as indicated in FIG. 4 it can be fashioned as a birdcage resonator 12.

The reception arrangement 13 comprises reception elements. In the case that the reception arrangement 13 comprises a number of superconducting reception coils 14, the reception elements are, for example, identical with the reception coils 14.

In the reception case, a reception current I that is caused by the received magnetic resonance signals M oscillates in a current flow direction x in the reception elements 14. When the reception arrangement 13 is identical with the transmission arrangement 12, in the transmission case an excitation current I' that generates the radio-frequency excitation field RF also oscillates in the current flow direction x in the reception elements 14. Given this case configuration an embodiment that is subsequently explained in detail in connection with FIG. 7 can be advantageous.

Figure 7:
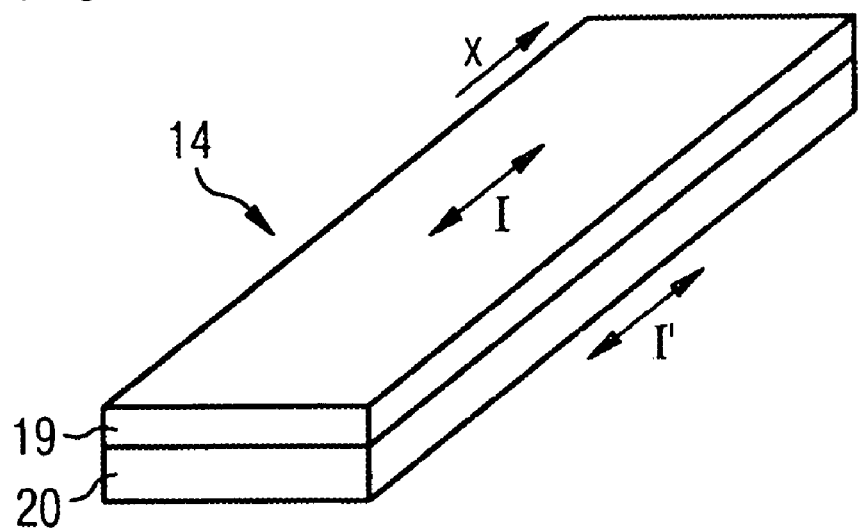
FIG. 7 schematically illustrates a cross-section through a reception element.

According to FIG. 7, the reception elements 14 (viewed transverse to the current flow direction x) respectively comprise a superconducting partial cross-section 19 and a non-superconducting partial cross-section 20. The two partial cross-sections 19, 20 can, for example, be connected with one another similar to a bi-metal strip. The superconducting section partial cross-section 19 exhibits a current carrying capacity that is greater than the reception current I. Due to this circumstance the reception current I oscillates nearly completely in the superconducting partial cross-section 19 since this partial cross-section 19 exhibits a significantly lower resistance (due to its superconductivity) than the non-superconducting partial cross-section 20. The current carrying capacity of the superconducting partial cross-section 19 is, however, smaller than the excitation current I'. The superconducting partial cross-section 19 is thus not superconducting with regard to the excitation current I'. It thus behaves like a "normal" resistive conductor for the excitation current I'. The resistance of the superconducting partial cross-section 19 for the excitation current I' is significantly greater than the resistance of the non-superconducting partial cross-section 20. The excitation current I' therefore oscillates nearly entirely in the non-superconducting partial cross-section 20.

An analogous effect can be utilized when the transmission arrangement is different from the reception arrangement 13. In this case the reception arrangement 13 is designed such that its maximum current carrying capacity is in fact greater than the reception current I. However, the maximum current carrying capacity is selected smaller than an induced current I" that is induced in the reception elements 14 by the radio-frequency excitation field RF. Thus the reception arrangement 13 need not have a detuning circuit (see FIG. 8). A detuning circuit 21 is required only for the transmission arrangement 12 so that the transmission arrangement 12 does not impair the reception of the magnetic resonance signals M.

Figure 8:
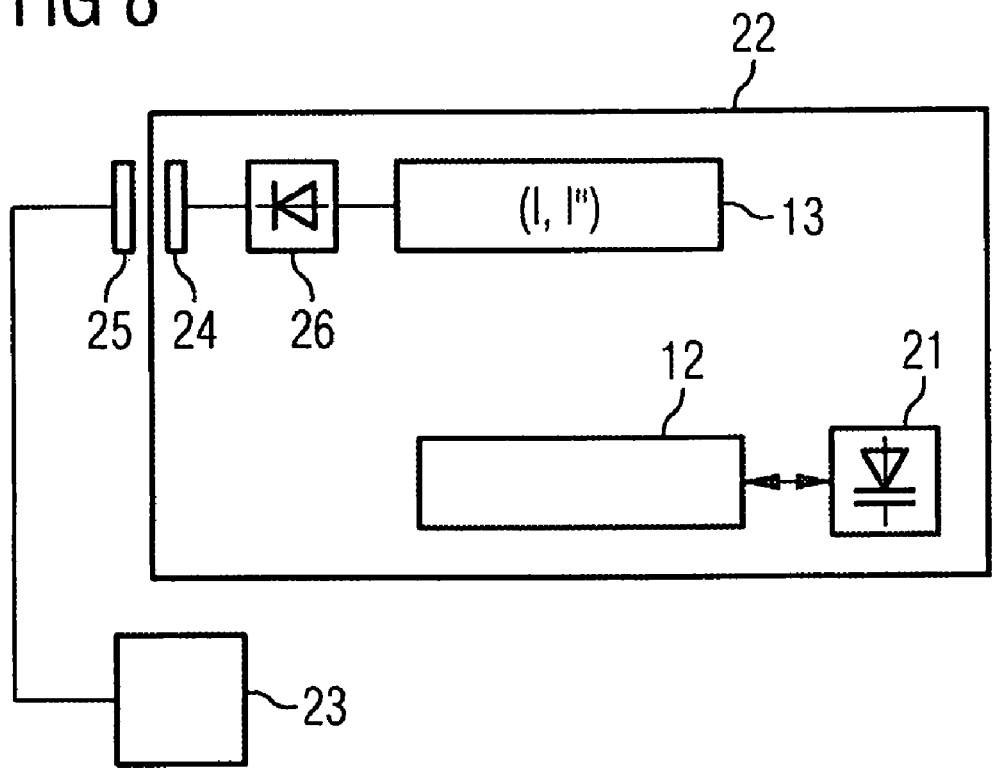
FIG. 8 illustrates a transmission arrangement and a reception arrangement.

FIG. 8 shows a further advantageous embodiment that can be realized independently of whether the reception arrangement 13 has a detuning circuit or not. According to FIG. 8, the transmission arrangement 12 is likewise cooled. It is thus located in a cooling reservoir 22 in which it is held at a temperature that lies below the boiling point of nitrogen (thus below −196°).

FIG. 8 also shows two further advantageous embodiments of the inventive magnetic resonance system. These two embodiments can also be realized independent of one another, whether the transmission arrangement 12 is identical with the reception arrangement 13 or not. These two embodiments can also be realized independently of one another.

The reception arrangement 13 according to FIG. 8 is completely encapsulated in the coolant reservoir 22. The transmission of a received magnetic resonance signal M to an evaluation device 23 ensues via first coupling elements 24 and second coupling elements 25. The first coupling elements 24 are arranged in the coolant reservoir 22 and are connected with the reception arrangement 13. The second coupling elements 25 are arranged outside of the coolant reservoir 22 and are connected with the evaluation device 23. The first coupling elements 24 inductively and/or capacitive interact with the second coupling elements 25. The coupling elements 24 and 25 allow the magnetic resonance signal M received from the reception arrangement 13 to be wirelessly taken from the reception arrangement 13 and transmitted to the evaluation device 23.

A preamplifier device 26 is arranged downstream of the reception arrangement 13. The preamplifier device 26 is also arranged in the coolant reservoir 22. It is thus also held to a temperature that lies below the boiling point of nitrogen.

A qualitatively higher-grade whole-body acquisition is thus possible in a simple manner by means of the inventively fashioned magnetic resonance system without having to apply a plurality of local coils on a person 6. A "screening" of the person 6 is thus possible, in particular in a simple manner analogous to CT systems.

Although modifications and changes may be suggested by those skilled in the art, it is the intention of the inventor to embody within the patent warranted heron all changes and modifications as reasonably and properly come within the scope of his contribution to the art.

I claim as my invention:

1. A magnetic resonance system comprising:
   a magnetic resonance data acquisition unit comprising an interior examination region that is open axially at opposite ends relative to a central axis, said examination region being radially surrounded by an inner wall of the data acquisition unit;
   a transport bed configured to receive an examination subject thereon and being movable to convey the examination subject into and out of the examination region;
   a basic field magnet built into the data acquisition unit that generates a static, basic magnetic field in the examination region;
   an RF energy transmission arrangement built into the data acquisition unit that radiates a substantially homogenous RF field in an entirety of the examination region, causing the examination subject in the examination region to emit magnetic resonance signals;
   a radio-frequency reception arrangement built into the data acquisition unit that receives the magnetic resonance signals emitted by the examination subject;
   said reception arrangement operating as a resistive arrangement when said radio-frequency energy is radiated by the transmission arrangement, and operating as a superconducting arrangement when said magnetic resonance signals are received by the reception arrangement; and
   a single structural arrangement that forms both said transmission arrangement and said reception arrangement, and that is operable in a transmission mode and a reception mode, said structural arrangement comprising current-carrying elements that carry a reception current in the reception mode and that carry an excitation current in the transmission mode that flows in a current flow direction, said current-carrying elements, transverse to said current flow direction, exhibiting a superconducting partial cross section and a non-superconducting partial cross section, said superconducting partial cross section having a current-carrying capacity between said reception current and said excitation current, and said reception current propagating in said superconducting partial cross section and said excitation current propagating in said non-superconducting partial cross section.

2. A magnetic resonance system as claimed in claim 1 wherein said current-carrying elements comprise a plurality of superconducting reception coils.

3. A magnetic resonance system as claimed in claim 2 wherein each of said reception coils comprises a plurality of conductor windings.

4. A magnetic resonance system as claimed in claim 1 wherein said structural arrangement comprises a birdcage resonator.

5. A magnetic resonance system as claimed in claim 1 wherein said transmission arrangement is a different structural arrangement from said reception arrangement, and wherein said reception arrangement comprises conductors having a current-carrying capacity that is smaller than an induced current that is induced in said reception arrangement by the radio-frequency energy radiated by said transmission arrangement.

6. A magnetic resonance system as claimed in claim 5 wherein said reception arrangement comprises a plurality of superconducting reception coils.

7. A magnetic resonance system as claimed in claim 5 wherein said transmission arrangement comprises a birdcage resonator.

8. A magnetic resonance system as claimed in claim 5 comprising a detuning circuit connected to said transmission arrangement, and said reception arrangement having no detuning circuit connected therewith.

9. A magnetic resonance system as claimed in claim 5 comprising a cooling arrangement that cools said transmission arrangement.

10. A magnetic resonance system as claimed in comprising:
    a magnetic resonance data acquisition unit comprising an interior examination region that is open axially at opposite ends relative to a central axis, said examination region being radially surrounded by an inner wall of the data acquisition unit;
    gradient coils built into said data acquisition unit;
    a transport bed configured to receive an examination subject thereon and being movable to convey the examination subject into and out of the examination region;
    a basic field magnet built into the data acquisition unit that generates a static, basic magnetic field in the examination region;
    an RF energy transmission arrangement built into the data acquisition unit that radiates a substantially homogenous RF field in an entirety of the examination region, causing the examination subject in the examination region to emit magnetic resonance signals;
    a radio-frequency reception arrangement built into the data acquisition unit that receives the magnetic resonance signals emitted by the examination subject, said reception arrangement comprising a plurality of reception coils, and comprising thermal shielding that shields said reception coils individually from said examination region and from said gradient coils; and
    said reception arrangement operating as a resistive arrangement when said radio-frequency energy is radiated by the transmission arrangement, and operating as a superconducting arrangement when said magnetic resonance signals are received by the reception arrangement.

11. A magnetic resonance system as claimed in claim 1 wherein said basic field magnet is a superconducting magnet.

12. A magnetic resonance system as claimed in claim 11 wherein said reception arrangement comprises a plurality of reception coils, and comprising a common cooling arrangement in thermal communication with both said basic field magnet and said reception coils that cools both said basic field magnet and said reception coils.

13. A magnetic resonance system comprising:
    a magnetic resonance data acquisition unit comprising an interior examination region that is open axially at opposite ends relative to a central axis, said examination region being radially surrounded by an inner wall of the data acquisition unit;

a transport bed configured to receive an examination subject thereon and being movable to convey the examination subject into and out of the examination region;

a basic field magnet built into the data acquisition unit that generates a static, basic magnetic field in the examination region;

an RF energy transmission arrangement built into the data acquisition unit that radiates a substantially homogenous RF field in an entirety of the examination region, causing the examination subject in the examination region to emit magnetic resonance signals;

a radio-frequency reception arrangement built into the data acquisition unit that receives the magnetic resonance signals emitted by the examination subject;

said reception arrangement operating as a resistive arrangement when said radio-frequency energy is radiated by the transmission arrangement, and operating as a superconducting arrangement when said magnetic resonance signals are received by the reception arrangement; and an evaluation device that wirelessly receives said magnetic resonance signal, received by the reception arrangement, from said reception arrangement.

14. A magnetic resonance system comprising:

a magnetic resonance data acquisition unit comprising an interior examination region that is open axially at opposite ends relative to a central axis, said examination region being radially surrounded by an inner wall of the data acquisition unit;

a transport bed configured to receive an examination subject thereon and being movable to convey the examination subject into and out of the examination region;

a basic field magnet built into the data acquisition unit that generates a static, basic magnetic field in the examination region;

an RF energy transmission arrangement built into the data acquisition unit that radiates a substantially homogenous RF field in an entirety of the examination region, causing the examination subject in the examination region to emit magnetic resonance signals;

a radio-frequency reception arrangement built into the data acquisition unit that receives the magnetic resonance signals emitted by the examination subject;

said reception arrangement operating as a resistive arrangement when said radio-frequency energy is radiated by the transmission arrangement, and operating as a superconducting arrangement when said magnetic resonance signals are received by the reception arrangement; and a cooled preamplifier connected downstream from said reception arrangement that pre-amplifies the magnetic resonance signal received by the reception arrangement.

* * * * *